US012563759B2

(12) United States Patent
Adachi et al.

(10) Patent No.: US 12,563,759 B2
(45) Date of Patent: Feb. 24, 2026

(54) SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kento Adachi, Ota (JP); Tatsunori Sakano, Shinagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 372 days.

(21) Appl. No.: 18/453,482

(22) Filed: Aug. 22, 2023

(65) Prior Publication Data

US 2024/0258411 A1    Aug. 1, 2024

(30) Foreign Application Priority Data

Feb. 1, 2023    (JP) ................................. 2023-014047

(51) Int. Cl.
| | |
|---|---|
| *H10D 12/00* | (2025.01) |
| *H10D 62/10* | (2025.01) |
| *H10D 64/27* | (2025.01) |

(52) U.S. Cl.
CPC ........... *H10D 12/481* (2025.01); *H10D 62/10* (2025.01); *H10D 64/513* (2025.01)

(58) Field of Classification Search
CPC ..... H10D 12/481; H10D 62/10; H10D 64/513
USPC ........................................................ 257/139
See application file for complete search history.

(56) References Cited

U.S. PATENT DOCUMENTS

| | | | | |
|---|---|---|---|---|
| 11,374,563 B2 * | 6/2022 | Sakano | ............... | H03K 17/168 |
| 12,362,746 B2 * | 7/2025 | Adachi | ............... | H03K 17/567 |
| 2021/0281258 A1 * | 9/2021 | Sakano | ............... | H03K 17/063 |

FOREIGN PATENT DOCUMENTS

JP          2021141304 A       9/2021

* cited by examiner

*Primary Examiner* — Igwe U Anya

(74) *Attorney, Agent, or Firm* — Maier & Maier, PLLC

(57) ABSTRACT

A voltage of a third gate electrode of a first semiconductor device transitions from a first off-voltage that is not more than a threshold voltage to a second off-voltage lower than the first off-voltage during a period from when a pulse signal for turning off a first gate electrode and a second gate electrode of the first semiconductor device is input to a drive device to when any one of a first gate electrode, a second gate electrode, and a third gate electrode of a second semiconductor device reaches an on-voltage.

11 Claims, 5 Drawing Sheets

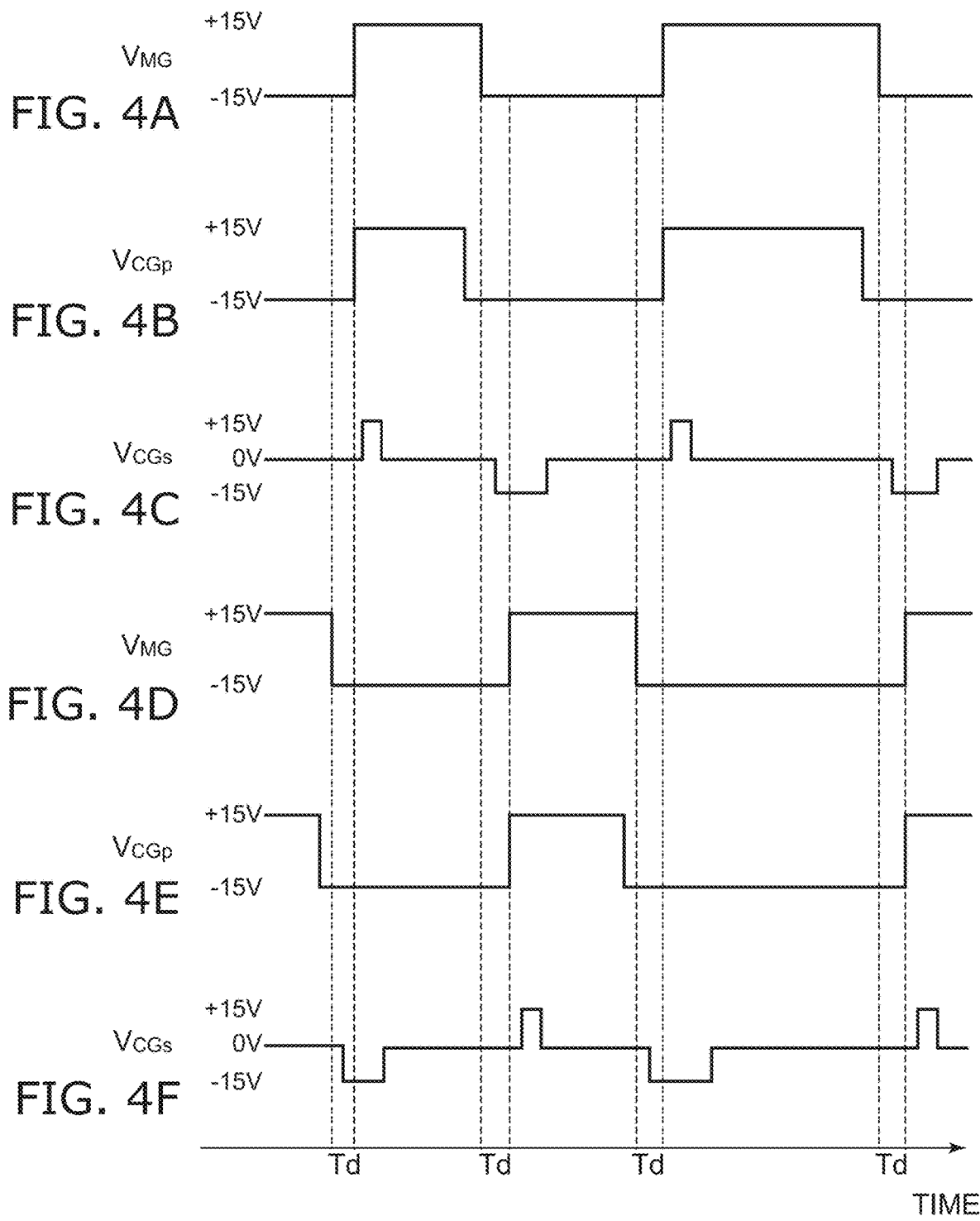
FIG. 4A    V_MG
FIG. 4B    V_CGp
FIG. 4C    V_CGs
FIG. 4D    V_MG
FIG. 4E    V_CGp
FIG. 4F    V_CGs

SEMICONDUCTOR MODULE

CROSS-REFERENCE TO RELATED APPLICATION

This application is based upon and claims the benefit of priority from Japanese Patent Application No. 2023-014047, filed on Feb. 1, 2023; the entire contents of which are incorporated herein by reference.

FIELD

Embodiments described herein relate generally to a semiconductor module.

BACKGROUND

An insulated gate bipolar transistor (IGBT) is widely used as a power semiconductor device that controls a high breakdown voltage and a large current. It is desirable that an IGBT used as a switching element has a low on-voltage and a low switching loss at the time of turning on and turning off. There is a double gate structure in which gate electrodes are separately formed in two systems and one of the gate electrodes is turned off first as a method of reducing a turn-off loss while maintaining a low on-voltage. However, since a short-circuit resistance decreases when a channel density increases, it is difficult to reduce a turn-on loss. An IGBT having a triple gate structure is proposed in which gate electrodes are divided into three systems, and a gate electrode of a third system is driven only at the time of turning on, thereby reducing a turn-on loss.

BRIEF DESCRIPTION OF THE DRAWINGS

FIGS. 4A to 4F are timing charts showing gate voltages of the semiconductor devices of the embodiment.

DETAILED DESCRIPTION

Figure 1:
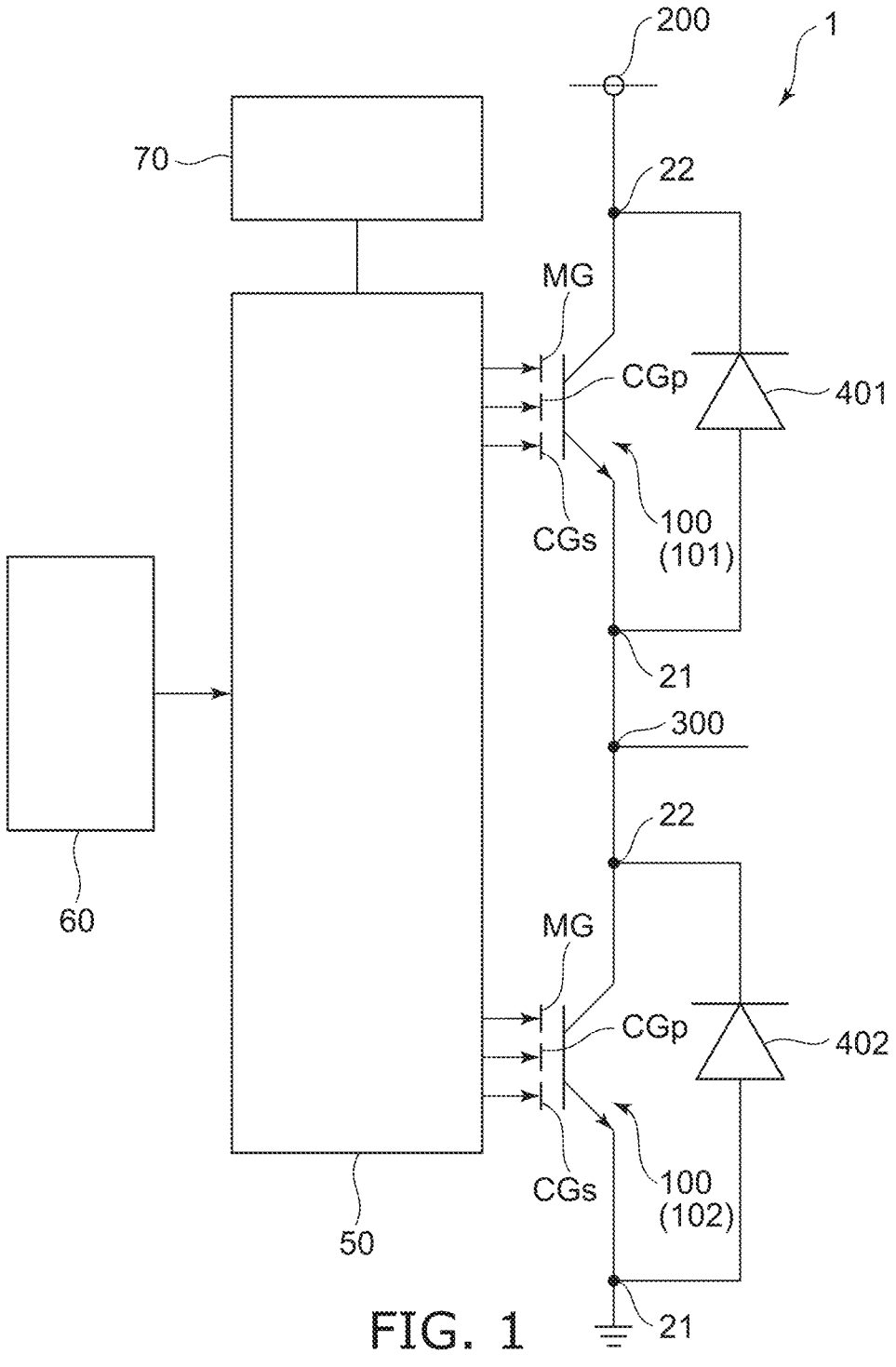
FIG. 1 is a schematic view showing a configuration of a semiconductor module of an embodiment.

According to one embodiment, a semiconductor module includes a first semiconductor device and a second semiconductor device each having a first gate electrode, a second gate electrode, and a third gate electrode, the first gate electrode, the second gate electrode, and the third gate electrode being controlled independently of one another, and during a period from when the first gate electrode is turned on to when the first gate electrode is turned off, an on-period of the second gate electrode being shorter than an on-period of the first gate electrode, and an on-period of the third gate electrode being shorter than the on-period of the second gate electrode; and a drive device configured to drive the first semiconductor device and the second semiconductor device, a voltage of the third gate electrode of the first semiconductor device transitioning from a first off-voltage that is not more than a threshold voltage to a second off-voltage lower than the first off-voltage during a period from when a pulse signal for turning off the first gate electrode and the second gate electrode of the first semiconductor device is input to the drive device to when any one of the first gate electrode, the second gate electrode, and the third gate electrode of the second semiconductor device reaches an on-voltage, and a voltage of the third gate electrode of the second semiconductor device transitioning from a third off-voltage that is not more than a threshold voltage to a fourth off-voltage lower than the third off-voltage during a period from when a pulse signal for turning off the first gate electrode and the second gate electrode of the second semiconductor device is input to the drive device to when any one of the first gate electrode, the second gate electrode, and the third gate electrode of the first semiconductor device reaches an on-voltage.

Hereinafter, embodiments will be described with reference to the drawings.

The drawings are schematic or conceptual, and a relationship between a thickness and a width of each portion, a ratio of sizes between portions, and the like are not necessarily the same as actual ones. Even if the same portions are shown, dimensions and ratios may be shown differently in the drawings.

The same or similar elements are denoted by the same reference numerals.

As shown in FIG. 1, a semiconductor module 1 of an embodiment includes a first semiconductor device 101, a second semiconductor device 102, and a drive device 50 that drives the first semiconductor device 101 and the second semiconductor device 102.

The first semiconductor device 101 and the second semiconductor device 102 are, for example, IGBTs, and have the same configuration. In the specification, the first semiconductor device 101 and the second semiconductor device 102 may be simply referred to as a semiconductor device 100 without being distinguished from each other.

Each of the first semiconductor device 101 and the second semiconductor device 102 includes a collector electrode 22, an emitter electrode 21, a first gate electrode MG, a second gate electrode CGp, and a third gate electrode CGs. The first gate electrode MG, the second gate electrode CGp, and the third gate electrode CGs are electrically independent of one another.

The first semiconductor device 101 and the second semiconductor device 102 are connected in series between a voltage source 200 and the ground. The collector electrode 22 of the first semiconductor device 101 is connected to the voltage source 200, the emitter electrode 21 of the first semiconductor device 101 is connected to the collector electrode 22 of the second semiconductor device 102, and the emitter electrode 21 of the second semiconductor device 102 is connected to the ground. A connection point (neutral point) 300 between the emitter electrode 21 of the first semiconductor device 101 and the collector electrode 22 of the second semiconductor device 102 is connected to a load (not shown).

A first freewheeling diode 401 is connected in parallel to the first semiconductor device 101 between the voltage source 200 and the neutral point 300. A forward direction of the first freewheeling diode 401 is a direction from the neutral point 300 toward the voltage source 200. A second freewheeling diode 402 is connected in parallel to the second semiconductor device 102 between the neutral point 300 and the ground. A forward direction of the second freewheeling diode 402 is a direction from the ground to the neutral point 300. The first freewheeling diode 401 and the second freewheeling diode 402 are, for example, Schottky barrier diodes.

The drive device 50 is electrically connected to gate electrodes of the first semiconductor device 101 and the second semiconductor device 102, and applies a gate voltage to the gate electrodes of the first semiconductor device 101 and the second semiconductor device 102. The gate voltage is, for example, a gate potential based on an emitter potential.

The semiconductor module 1 may include a pulse generator 60 and a control device 70. The pulse generator 60 outputs a pulse signal to the drive device 50, and the drive device 50 applies a pulsed gate voltage to gate electrodes of the first semiconductor device 101 and the second semiconductor device 102 in accordance with the pulse signal from the pulse generator 60. An output of the pulse generator 60 is connected to an input of the drive device 50. The control device 70 controls the drive device 50.

An example of a structure of the semiconductor device 100 (the first semiconductor device 101 and the second semiconductor device 102) will be described with reference to FIG. 2.

The semiconductor device 100 has, for example, a trench gate structure. The semiconductor device 100 includes the emitter electrode 21, the collector electrode 22, a semiconductor portion 10, the first gate electrode MG, the second gate electrode CGp, the third gate electrode CGs, a first insulating film 41, a second insulating film 42, and a third insulating film 43. In FIG. 2, the emitter electrode 21 is shown by a two-dot chain line in order to clearly show a surface of the semiconductor portion 10 covered by the emitter electrode 21.

The emitter electrode 21 and the collector electrode 22 are separated from each other in a first direction Z. In FIG. 2, two directions orthogonal to the first direction Z are referred to as a second direction X and a third direction Y. The second direction X and the third direction Y are orthogonal to each other.

The semiconductor portion 10 is provided between the emitter electrode 21 and the collector electrode 22 in the first direction Z. A material of the semiconductor portion 10 is, for example, silicon. The material of the semiconductor portion 10 may be, for example, silicon carbide and gallium nitride.

The semiconductor portion 10 includes a first semiconductor layer 11 of a first conductivity-type, a second semiconductor layer 12 of a second conductivity-type, a third semiconductor layer 13 of the first conductivity-type, and a fourth semiconductor layer 14 of the second conductivity-type. In the embodiment, for example, the first conductivity-type is an n-type, and the second conductivity-type is a p-type.

The semiconductor portion 10 has multiple mesa portions 30 located apart from one another in the second direction X. Each of the mesa portions 30 extends in the third direction Y. Each of the mesa portions 30 includes a part of the first semiconductor layer 11, the second semiconductor layer 12, and the third semiconductor layer 13.

The first semiconductor layer 11 is, for example, an n-type drift layer of an IGBT. The second semiconductor layer 12 is, for example, a p-type base layer of an IGBT. The second semiconductor layer 12 is provided d between the first semiconductor layer 11 and the third semiconductor layer 13 in the first direction Z.

The third semiconductor layer 13 is, for example, an n-type emitter layer of an IGBT. An n-type impurity concentration of the third semiconductor layer 13 is higher than an n-type impurity concentration of the first semiconductor layer 11. The third semiconductor layer 13 is provided between the second semiconductor layer 12 and the emitter electrode 21 in the first direction Z, and is electrically connected to the emitter electrode 21.

The fourth semiconductor layer 14 is, for example, a p-type collector layer of an IGBT. A p-type impurity concentration of the fourth semiconductor layer 14 is higher than a p-type impurity concentration of the second semiconductor layer 12. The fourth semiconductor layer 14 is provided between the collector electrode 22 and the first semiconductor layer 11 in the first direction Z, and is electrically connected to the collector electrode 22.

The semiconductor portion 10 may further include a fifth semiconductor layer 15 of the second conductivity-type and a sixth semiconductor layer 16 of the first conductivity-type.

The fifth semiconductor layer 15 is, for example, a p-type base contact layer of an IGBT. A p-type impurity concentration of the fifth semiconductor layer 15 is higher than a p-type impurity concentration of the second semiconductor layer 12. The fifth semiconductor layer 15 is provided between the second semiconductor layer 12 and the emitter electrode 21, and is electrically connected to the second semiconductor layer 12 and the emitter electrode 21. The fifth semiconductor layer 15 is included in the mesa portion 30. For example, the third semiconductor layer 13 and the fifth semiconductor layer 15 are alternately arranged in the third direction Y on the second semiconductor layer 12 of the mesa portion 30.

The sixth semiconductor layer 16 is, for example, an n-type buffer layer of an IGBT. An n-type impurity concentration of the sixth semiconductor layer 16 is higher than an n-type impurity concentration of the first semiconductor layer 11. The sixth semiconductor layer 16 is provided between the fourth semiconductor layer 14 and the first semiconductor layer 11 in the first direction Z.

The first gate electrode MG, the second gate electrode CGp, and the third gate electrode CGs are provided between the semiconductor portion 10 and the emitter electrode 21 in the first direction Z. The first gate electrode MG, the second gate electrode CGp, and the third gate electrode CGs are electrically isolated from one another. The first gate electrode MG, the second gate electrode CGp, and the third gate electrode CGs may be made of, for example, polycrystalline silicon.

Figure 2:
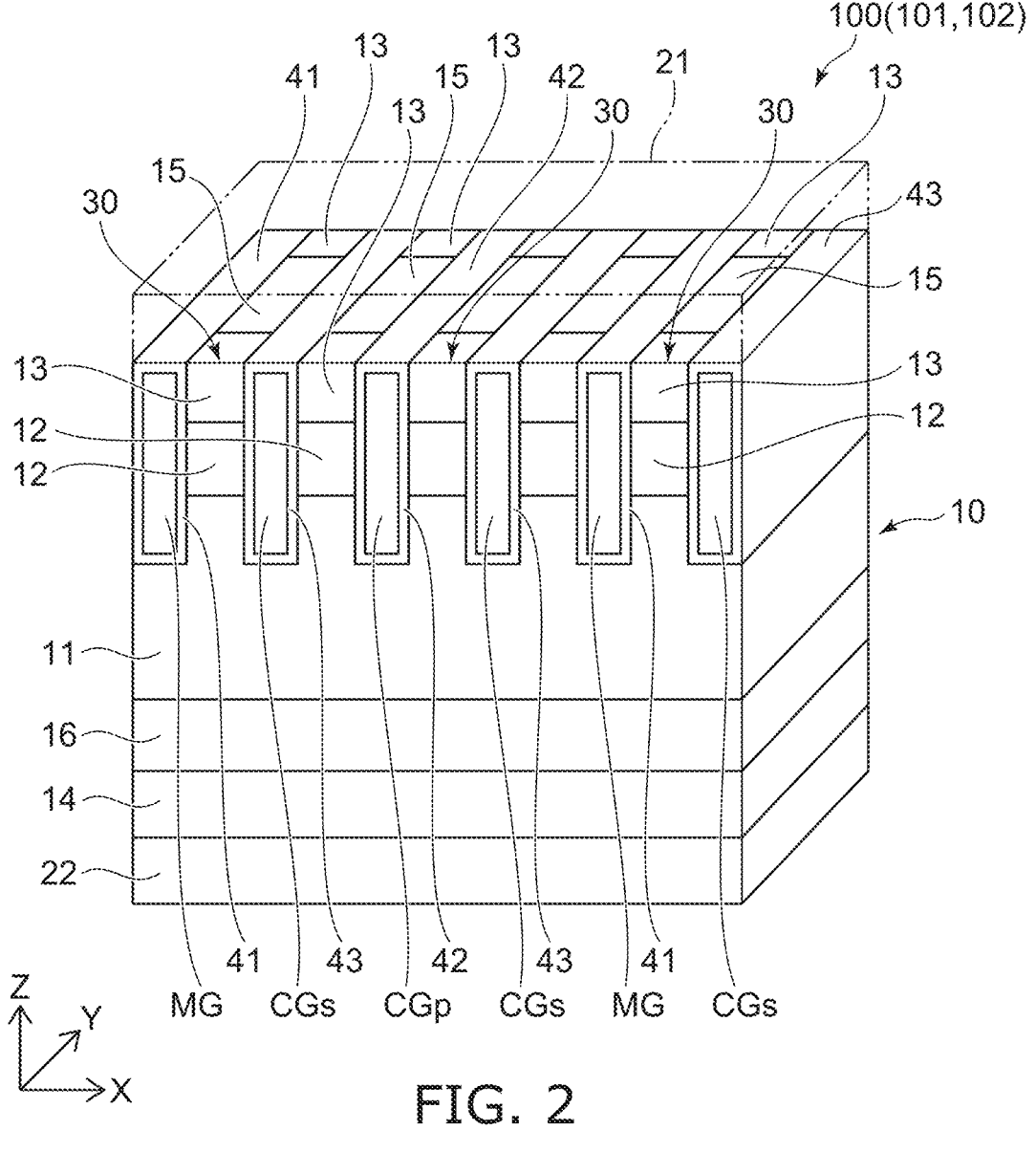
FIG. 2 is a cross-sectional perspective view showing semiconductor devices of the embodiment.

The structure shown in FIG. 2 is repeated multiple times in the second direction X. That is, multiple first gate electrodes MG, multiple second gate electrodes CGp, and multiple third gate electrodes CGs are disposed in a manner of being separated from one another in the second direction X. The first gate electrode MG, the second gate electrode CGp, and the third gate electrode CGs extend in the third direction Y. For example, the multiple first gate electrodes MG, the multiple second gate electrodes CGp, and the multiple third gate electrodes CGs are electrically connected to gate electrodes of the same system at end portions in the third direction Y. The third gate electrode CGs is disposed, for example, between the first gate electrode MG and the second gate electrode CGp adjacent to each other in the second direction X. FIG. 2 shows, as an example of the order of gate electrodes in the second direction X, a structure in which the first gate electrode MG is adjacent to the third gate electrode CGs, the second gate electrode CGp is adjacent to the third gate electrode CGs, and the first gate electrode MG is not adjacent to the second gate electrode CGp. A proportion and a density of each gate electrode are not limited to those shown in FIG. 2.

The first insulating film 41 is provided between the first gate electrode MG and the semiconductor portion 10. The first gate electrode MG is adjacent to the mesa portion 30 with the first insulating film 41 interposed therebetween in the second direction X. A side surface of the first gate electrode MG in the second direction X faces the first semiconductor layer 11, the second semiconductor layer 12, the third semiconductor layer 13, and the fifth semiconductor layer 15 of the mesa portion 30 with the first insulating film 41 interposed therebetween. The first insulating film 41 is also provided between an upper end of the first gate electrode MG and the emitter electrode 21.

The second insulating film 42 is provided between the second gate electrode CGp and the semiconductor portion 10. The second gate electrode CGp is adjacent to the mesa portion 30 with the second insulating film 42 interposed therebetween in the second direction X. A side surface of the second gate electrode CGp in the second direction X faces the first semiconductor layer 11, the second semiconductor layer 12, the third semiconductor layer 13, and the fifth semiconductor layer 15 of the mesa portion 30 with the second insulating film 42 interposed therebetween. The second insulating film 42 is also provided between an upper end of the second gate electrode CGp and the emitter electrode 21.

The third insulating film 43 is provided between the third gate electrode CGs and the semiconductor portion 10. The third gate electrode CGs is adjacent to the mesa portion 30 with the third insulating film 43 interposed therebetween in the second direction X. A side surface of the third gate electrode CGs in the second direction X faces the first semiconductor layer 11, the second semiconductor layer 12, the third semiconductor layer 13, and the fifth semiconductor layer 15 of the mesa portion 30 with the third insulating film 43 interposed therebetween. The third insulating film 43 is also provided between an upper end of the third gate electrode CGs and the emitter electrode 21.

The first insulating film 41, the second insulating film 42, and the third insulating film 43 are, for example, silicon oxide films or silicon nitride films.

The first semiconductor device 101 and the second semiconductor device 102 are alternately turned on and off by the drive device 50. The second semiconductor device 102 is turned off during a period in which the first semiconductor device 101 is turned on, and the first semiconductor device 101 is turned off during a period in which the second semiconductor device 102 is turned on. A dead time Td is set to prevent a through current from flowing from the voltage source 200 to the ground via the first semiconductor device 101 and the second semiconductor device 102, and the dead time Td is a period in which both the first semiconductor device 101 and the second semiconductor device 102 are turned off.

Figures 3A, 3B, 3C, 3D, 3E, 3F:
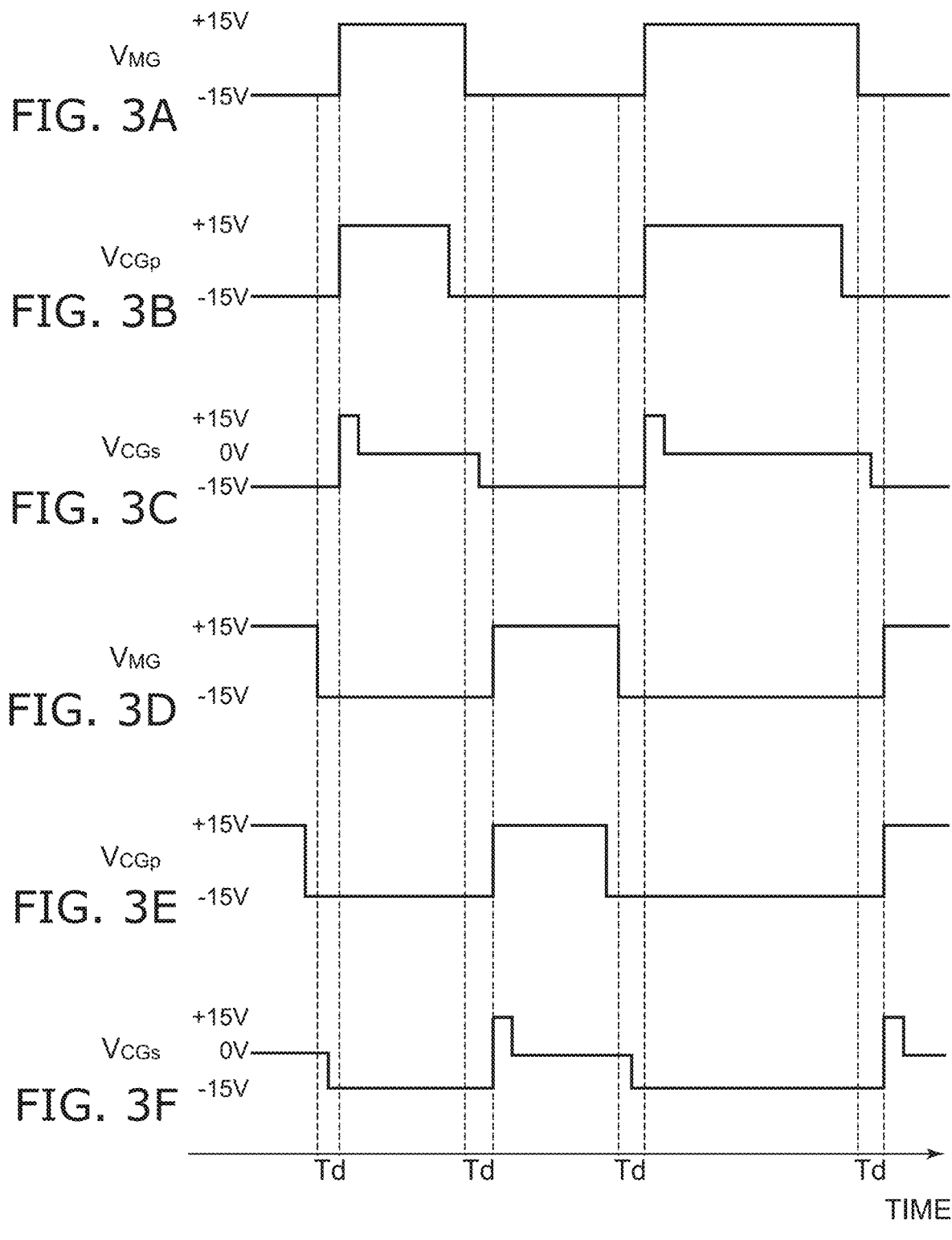
FIGS. 3A to 3F are timing charts showing gate voltages of the semiconductor devices of the embodiment.

FIG. 3A shows a gate voltage $V_{MG}$ applied to the first gate electrode MG of the first semiconductor device 101.

FIG. 3B shows a second gate voltage $V_{CGp}$ applied to the second gate electrode CGp of the first semiconductor device 101.

FIG. 3C shows a third gate voltage $V_{CGs}$ applied to the third gate electrode CGs of the first semiconductor device 101.

FIG. 3D shows a gate voltage $V_{MG}$ applied to the first gate electrode MG of the second semiconductor device 102.

FIG. 3E shows a second gate voltage $V_{CGp}$ applied to the second gate electrode CGp of the second semiconductor device 102.

FIG. 3F shows a third gate voltage $V_{CGs}$ applied to the third gate electrode CGs of the second semiconductor device 102.

The first gate electrode MG, the second gate electrode CGp, and the third gate electrode CGs of each of the semiconductor devices 101 and 102 are controlled independently of one another. In each of the semiconductor devices 101 and 102, during a period from when the first gate electrode MG is turned on to when the first gate electrode MG is turned off, an on-period of the second gate electrode CGp is shorter than an on-period of the first gate electrode MG, and an on-period of the third gate electrode CGs is shorter than the on-period of the second gate electrode CGp.

Each of the semiconductor devices 101 and 102 is turned on and off by the first gate electrode MG. The second gate electrode CGp is turned off before the first gate electrode MG when the semiconductor devices 101 and 102 are turned off. The third gate electrode CGs is turned on for a short period of time when the semiconductor devices 101 and 102 are turned on.

A first channel (n-type inversion layer) is induced in a region facing the first gate electrode MG in the second semiconductor layer 12 by setting the gate voltage $V_{MG}$ applied to the first gate electrode MG to be higher than a threshold voltage of the first gate electrode MG. Electrons are injected from the emitter electrode 21 into the first semiconductor layer 11 via the third semiconductor layer 13 and the first channel. In response to this, holes are injected from the fourth semiconductor layer 14 into the first semiconductor layer 11 via the sixth semiconductor layer 16. This state is referred to as an on-state of the first gate electrode MG. An on-voltage of the first gate electrode MG can be set to, for example, +15 V.

A second channel (n-type inversion layer) is induced in a region facing the second gate electrode CGp in the second semiconductor layer 12 by setting the gate voltage $V_{CGp}$ applied to the second gate electrode CGp to be higher than a threshold voltage of the second gate electrode CGp. Electrons are injected from the emitter electrode 21 into the first semiconductor layer 11 via the third semiconductor layer 13 and the second channel. In response to this, holes are injected from the fourth semiconductor layer 14 into the first semiconductor layer 11 via the sixth semiconductor layer 16. This state is referred to as an on-state of the second gate electrode CGp. An on-voltage of the second gate electrode CGp can be set to, for example, +15 V.

A third channel (n-type inversion layer) is induced in a region facing the third gate electrode CGs in the second semiconductor layer 12 by setting the gate voltage $V_{CGs}$ applied to the third gate electrode CGs to be higher than a threshold voltage of the third gate electrode CGs. Electrons are injected from the emitter electrode 21 into the first semiconductor layer 11 via the third semiconductor layer 13 and the third channel. In response to this, holes are injected from the fourth semiconductor layer 14 into the first semiconductor layer 11 via the sixth semiconductor layer 16. This state is referred to as an on-state of the third gate electrode CGs. An on-voltage of the third gate electrode CGs can be set to, for example, +15 V.

For example, the first gate electrode MG, the second gate electrode CGp, and the third gate electrode CGs are turned on at the same time. The third gate electrode CGs may be turned on after the first gate electrode MG and the second gate electrode CGp are turned on. When the semiconductor devices 101 and 102 are turned on, an amount of electrons injected into the first semiconductor layer 11 can be increased in a short period of time by turning on the first gate electrode MG, the second gate electrode CGp, and the third gate electrode CGs, and a turn-on loss can be reduced. During an on-period other than a time when the semiconductor devices 101 and 102 are turned on, a saturation current can be kept low and a short-circuit resistance can be secured by turning off the third gate electrode CGs (the third channel disappears).

The third channel of the region facing the third gate electrode CGs in the second semiconductor layer 12 disappears by setting the gate voltage $V_{CGs}$ of the third gate electrode CGs to a threshold voltage or less. This state is referred to as an off-state of the third gate electrode CGs. An off-voltage of the third gate electrode CGs is set in two stages.

An off-voltage of the third gate electrode CGs of the first semiconductor device 101 is set in two stages, that is, a first off-voltage and a second off-voltage lower than the first off-voltage. An off-voltage of the third gate electrode CGs of the second semiconductor device 102 is set in two stages, that is, a third off-voltage and a fourth off-voltage lower than the third off-voltage. The first off-voltage and the third off-voltage can be set to, for example, 0 V. The second off-voltage and the fourth off-voltage can be set to negative voltages, and can be set to, for example, −15 V.

Therefore, the third gate electrode CGs is controlled by three potential levels (for example, +15 V, 0 V, and −15 V), including an on-voltage, a first off-voltage, and a second off-voltage.

The third gate electrode CGs of the first semiconductor device 101 is turned off by being transitioned from an on-voltage to the first off-voltage. The first off-voltage of the third gate electrode CGs of the first semiconductor device 101 is maintained until a subsequent dead time period Td. The third gate electrode CGs of the second semiconductor device 102 is turned off by being transitioned from an on-voltage to the third off-voltage. The third off-voltage of the third gate electrode CGs of the second semiconductor device 102 is maintained until a subsequent dead time period Td.

The second channel of the region facing the second gate electrode CGp in the second semiconductor layer 12 disappears by setting the second gate voltage $V_{CGp}$ of the second gate electrode CGp to a threshold voltage or less. This state is referred to as an off-state of the second gate electrode CGp. An amount of electrons injected into the first semiconductor layer 11 can be reduced and a turn-off loss can be reduced, by turning off the second gate electrode CGp before the first gate electrode MG. A fourth channel (p-type inversion layer) and a fifth channel (p-type inversion layer) are induced in regions facing the second gate electrode CGp in the first semiconductor layer 11 and the third semiconductor layer 13, by setting the second gate voltage $V_{CGp}$ to a negative voltage. Holes are extracted from the first semiconductor layer 11 to the emitter electrode 21 via the fourth channel, the second semiconductor layer 12, and the fifth channel. Accordingly, a carrier density of the first semiconductor layer 11 is reduced, and thus the turn-off loss can be further reduced. An off-voltage of the second gate electrode CGp can be set to, for example, −15 V.

After the second gate electrode CGp is turned off, the first channel of the region facing the first gate electrode MG in the second semiconductor layer 12 disappears by setting the first gate voltage $V_{MG}$ of the first gate electrode MG to be lower than a threshold voltage. This state is referred to as an off-state of the first gate electrode MG. An off-voltage of the first gate electrode MG can be set to, for example, −15 V.

For example, a threshold voltage of the first gate electrode MG, a threshold voltage of the second gate electrode CGp, and a threshold voltage of the third gate electrode CGs can be the same.

The first gate electrode MG and the second gate electrode CGp are controlled by potential levels of two stages (for example, +15 V and −15 V).

In a case where the first semiconductor device 101 which is a high-side element and the second semiconductor device 102 which is a low-side element are alternately switched, generally, when a gate voltage is 0 V, a problem of erroneous ignition of a semiconductor device may occur.

From the dead time period Td in which the first semiconductor device 101 and the second semiconductor device 102 are both turned off to a timing when the first semiconductor device 101 is turned on, a potential (for example, 600 V) of the voltage source 200 is applied to the neutral point 300, and a potential change (dv/dt) of the neutral point 300 is steep. At this time, a current i expressed by a parasitic capacitance C between a gate electrode and a collector electrode of the second semiconductor device 102×(dv/dt) flows through the gate electrode of the second semiconductor device 102, and a voltage V expressed by a gate resistance R×the current i is applied to the gate electrode of the second semiconductor device 102. When the voltage V is higher than a threshold voltage of the gate electrode of the second semiconductor device 102, the second semiconductor device 102 may be erroneously ignited.

On the other hand, from the dead time period Td in which the first semiconductor device 101 and the second semiconductor device 102 are both turned off to a timing when the second semiconductor device 102 is turned on, the potential of the neutral point 300 sharply changes from a potential (for example, 600 V) of the voltage source 200 to 0 V. At this time, a current i expressed by a parasitic capacitance C between a gate electrode and a collector electrode of the first semiconductor device 101×a potential change (dv/dt) of the neutral point 300 flows through the gate electrode of the first semiconductor device 101, and a voltage V expressed by a gate resistance R×the current i is applied to the gate electrode of the first semiconductor device 101. When the voltage V is higher than a threshold voltage of the gate electrode of the first semiconductor device 101, the first semiconductor device 101 may be erroneously ignited.

According to the embodiment, during the dead time period Td before the second semiconductor device 102 is turned on, erroneous ignition of the third gate electrode CGs of the first semiconductor device 101 is prevented by transitioning the gate voltage $V_{CGs}$ of the third gate electrode CGs of the first semiconductor device 101 from the first off-voltage to the second off-voltage lower than the first off-voltage. During the dead time period Td before the first semiconductor device 101 is turned on, erroneous ignition of the third gate electrode CGs of the second semiconductor device 102 is prevented by transitioning the gate voltage $V_{CGs}$ of the third gate electrode CGs of the second semiconductor device 102 from the third off-voltage to the fourth off-voltage lower than the third off-voltage.

During a period in which the first gate electrode MG and the second gate electrode CGp are turned on before the first semiconductor device 101 is turned off, or during a period in which only the first gate electrode MG is turned on, when the gate voltage $V_{CGs}$ of the third gate electrode CGs of the first semiconductor device 101 is set to the second off-voltage, there is a concern that a conduction loss of the first semiconductor device 101 deteriorates. Similarly, during a period in which the first gate electrode MG and the second gate electrode CGp are turned on before the second semiconductor device 102 is turned off, or during a period in which only the first gate electrode MG is turned on, when the gate voltage $V_{CGs}$ of the third gate electrode CGs of the second semiconductor device 102 is set to the fourth off-voltage, there is a concern that a conduction loss of the second semiconductor device 102 deteriorates.

A sixth channel (p-type inversion layer) and a seventh channel (p-type inversion layer) are induced in regions facing the third gate electrode CGs in the first semiconductor layer 11 and the third semiconductor layer 13 by setting the third gate voltage $V_{CGs}$ of the third gate electrode CGs to a negative voltage. Holes are extracted from the first semiconductor layer 11 to the emitter electrode 21 via the sixth channel, the second semiconductor layer 12, and the seventh channel. Accordingly, a carrier density of the first semiconductor layer 11 is reduced, and a conduction loss deteriorates. A depletion layer formed in the vicinity of the sixth channel of the first semiconductor layer 11 and a depletion layer formed in the vicinity of the seventh channel of the third semiconductor layer 13 narrow an electron injection path, and thus a conduction loss deteriorates.

Therefore, according to the embodiment, the gate voltage $V_{CGs}$ of the third gate electrode CGs of the first semiconductor device 101 is transitioned from the first off-voltage that is not more than a threshold voltage to the second off-voltage during a period from when a pulse signal for turning off the first gate electrode MG and the second gate electrode CGp of the first semiconductor device 101 is input from the pulse generator 60 to the drive device 50 to when a gate voltage of any one of the first gate electrode MG, the second gate electrode CGp, and the third gate electrode CGs of the second semiconductor device 102 on an opposite side reaches an on-voltage.

That is, erroneous ignition of the third gate electrode CGs of the first semiconductor device 101 due to a displacement current flowing when the second semiconductor device 102 is turned on can be prevented by transitioning the gate voltage $V_{CGs}$ of the third gate electrode CGs of the first semiconductor device 101 from the first off-voltage to the second off-voltage during the dead time period Td before the second semiconductor device 102 on the opposite side is turned on. In addition, since the gate voltage $V_{CGs}$ of the third gate electrode CGs of the first semiconductor device 101 is not the second off-voltage during a period in which the first gate electrode MG of the first semiconductor device 101 is turned on and a period in which the second gate electrode CGp is turned on, a conduction loss of the first semiconductor device 101 can be reduced.

The gate voltage $V_{CGs}$ of the third gate electrode CGs of the second semiconductor device 102 is transitioned from the third off-voltage that is not more than a threshold voltage to the fourth off-voltage during a period from when a pulse signal for turning off the first gate electrode MG and the second gate electrode CGp of the second semiconductor device 102 is input from the pulse generator 60 to the drive device 50 to when a gate voltage of any one of the first gate electrode MG, the second gate electrode CGp, and the third gate electrode CGs of the first semiconductor device 101 on an opposite side reaches an on-voltage.

That is, erroneous ignition of the third gate electrode CGs of the second semiconductor device 102 due to a displacement current flowing when the first semiconductor device 101 is turned on can be prevented by transitioning the gate voltage $V_{CGs}$ of the third gate electrode CGs of the second semiconductor device 102 from the third off-voltage to the fourth off-voltage during the dead time period Td before the first semiconductor device 101 on the opposite side is turned on. In addition, since the gate voltage $V_{CGs}$ of the third gate electrode CGs of the second semiconductor device 102 is not the fourth off-voltage during a period in which the first gate electrode MG of the second semiconductor device 102 is turned on and a period in which the second gate electrode CGp is turned on, a conduction loss of the second semiconductor device 102 can be reduced.

As a result, according to the embodiment, a semiconductor module capable of preventing erroneous ignition while reducing a conduction loss and a switching loss can be provided.

FIGS. 4A to 4F show another example of timing charts of the gate voltages of the semiconductor devices 101 and 102.

FIG. 4A shows the gate voltage $V_{MG}$ applied to the first gate electrode MG of the first semiconductor device 101.

FIG. 4B shows the second gate voltage $V_{CGp}$ applied to the second gate electrode CGp of the first semiconductor device 101.

FIG. 4C shows the third gate voltage $V_{CGs}$ applied to the third gate electrode CGs of the first semiconductor device 101.

FIG. 4D shows the gate voltage $V_{MG}$ applied to the first gate electrode MG of the second semiconductor device 102.

FIG. 4E shows the second gate voltage $V_{CGp}$ applied to the second gate electrode CGp of the second semiconductor device 102.

FIG. 4F shows the third gate voltage $V_{CGs}$ applied to the third gate electrode CGs of the second semiconductor device 102.

In the example, when the first semiconductor device 101 is turned on, the gate voltage $V_{CGs}$ of the third gate electrode CGs of the first semiconductor device 101 is increased from the first off-voltage (for example, 0 V) to an on-voltage (for example, +15 V). Similarly, when the second semiconductor device 102 is turned on, the gate voltage $V_{CGs}$ of the third gate electrode CGs of the second semiconductor device 102 is increased from the third off-voltage (for example, 0 V) to an on-voltage (for example, +15 V).

On the other hand, when the semiconductor devices 101 and 102 are turned on, the first gate electrode MG and the second gate electrode CGp are increased from −15 V to +15 V. That is, when the semiconductor devices 101 and 102 are turned on, a gate voltage fluctuation (15 V) of the third gate electrode CGs is smaller than a gate voltage fluctuation (30 V) of the first gate electrode MG and a gate voltage fluctuation (30 V) of the second gate electrode CGp. Due to a difference in the gate voltage fluctuations, when the first gate electrode MG and the second gate electrode CGp are turned on later than the third gate electrode CGs, an effect of reducing a turn-on loss is likely to be lowered.

Therefore, when the semiconductor devices 101 and 102 are turned on, a turn-on time difference caused by an off-voltage difference between the first gate electrode MG and the second gate electrode CGp, and the third gate electrode CGs can be adjusted by delaying turning-on of the third gate electrode CGs to be later than turning-on of the first gate electrode MG and turning-on of the second gate electrode CGp. Accordingly, the first gate electrode MG and the second gate electrode CGp are less likely to be turned on later than the third gate electrode CGs.

A timing when the gate voltage $V_{CGs}$ of the third gate electrode CGs of the first semiconductor device 101 is returned from the second off-voltage to the first off-voltage may be any timing after the second semiconductor device 102 on an opposite side is turned on.

In the example of FIG. 4C, after the gate voltage $V_{CGs}$ of the third gate electrode CGs of the first semiconductor device 101 transitions to the second off-voltage, and the first gate electrode MG and the second gate electrode CGp of the second semiconductor device 102 are turned on, the gate voltage $V_{CGs}$ of the third gate electrode CGs of the first semiconductor device 101 returns to the first off-voltage during a period up to when the first gate electrode MG and the second gate electrode CGp of the first semiconductor device 101 are turned on.

A timing of returning the gate voltage $V_{CGs}$ of the third gate electrode CGs of the second semiconductor device 102 from the fourth off-voltage to the third off-voltage may be any timing after the first semiconductor device 101 on an opposite side is turned on.

In the example of FIG. 4F, the gate voltage $V_{CGs}$ of the third gate electrode CGs of the second semiconductor device 102 transitions to the fourth off-voltage, and the first gate electrode MG and the second gate electrode CGp of the first semiconductor device 101 are turned on, the gate voltage $V_{CGs}$ of the third gate electrode CGs of the second semiconductor device 102 returns to the third off-voltage during a period up to when the first gate electrode MG and the second gate electrode CGp of the second semiconductor device 102 are turned on.

As shown in FIG. 3C, after the gate voltage $V_{CGs}$ of the third gate electrode CGs of the first semiconductor device 101 transitions to the second off-voltage, the gate voltage $V_{CGs}$ of the third gate electrode CGs of the first semiconductor device 101 does not return to the first off-voltage and may be increased from the second off-voltage to an on-voltage when the subsequent first semiconductor device 101 is turned on.

Similarly, as shown in FIG. 3F, after the gate voltage $V_{CGs}$ of the third gate electrode CGs of the second semiconductor device 102 transitions to the fourth off-voltage, the gate voltage $V_{CGs}$ of the third gate electrode CGs of the second semiconductor device 102 does not return to the third off-voltage and may be increased from the fourth off-voltage to an on-voltage when the subsequent second semiconductor device 102 is turned on.

Next, a start point and an end point of the dead time period will be described with reference to FIGS. 5A to 5D.

Figures 5A, 5B, 5C, 5D:
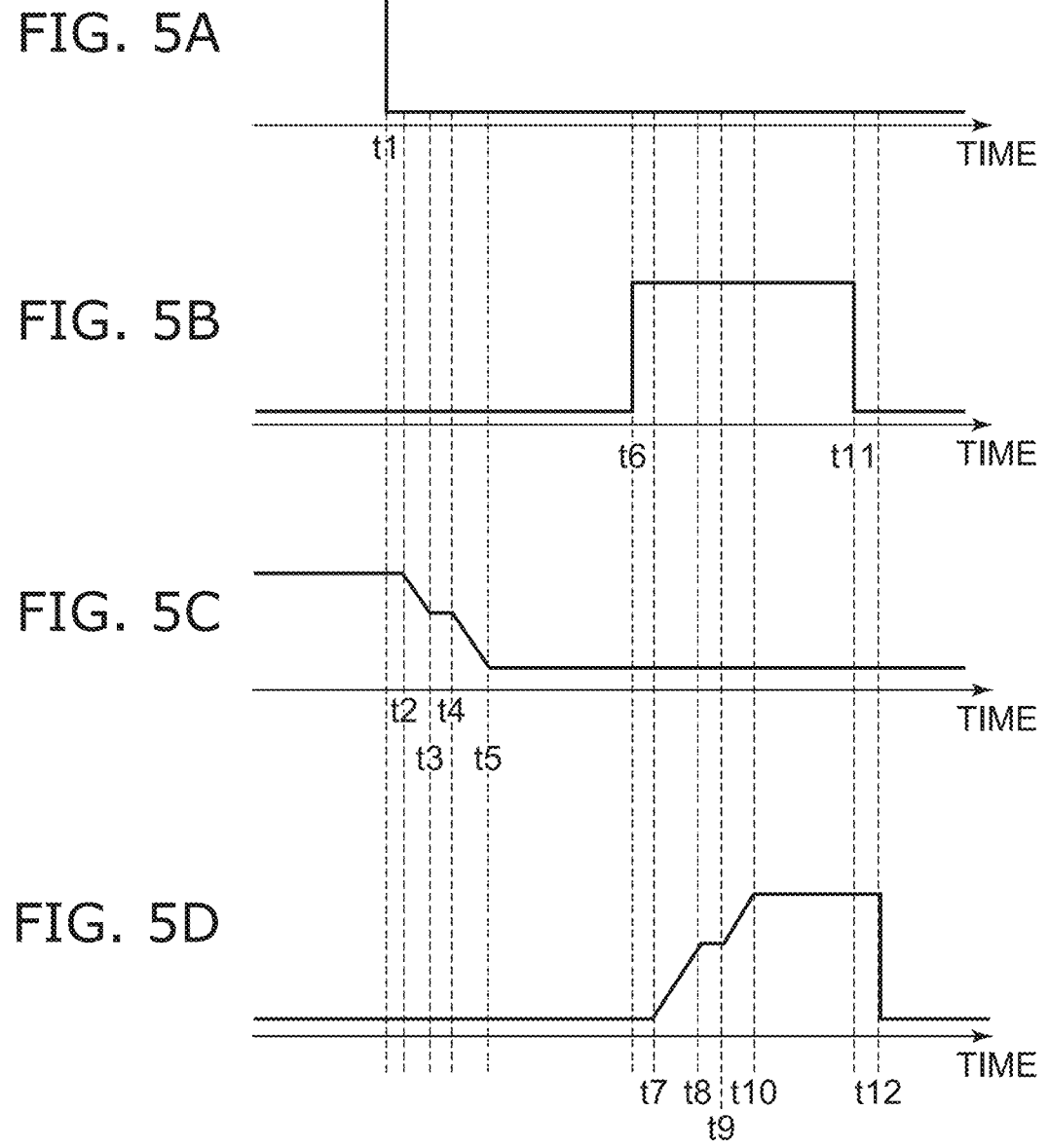
FIGS. 5A and 5B are timing charts showing pulse signals output by a pulse generator.
FIGS. 5C and 5D are timing charts showing gate voltages of the semiconductor devices of the embodiment.

FIGS. 5A and 5B show pulse signals output from the pulse generator 60 and input to the drive device 50.

FIG. 5A shows a pulse signal for controlling a gate voltage ($V_{MG}$, $V_{CGp}$) of one of the first semiconductor device 101 and the second semiconductor device 102.

FIG. 5B shows a pulse signal for controlling a gate voltage ($V_{MG}$, $V_{CGp}$) of the other one of the first semiconductor device 101 and the second semiconductor device 102.

FIG. 5C shows the gate voltage ($V_{MG}$, $V_{CGp}$) of the one semiconductor device controlled according to the pulse signal shown in FIG. 5A.

FIG. 5D shows the gate voltage ($V_{MG}$, $V_{CGp}$) of the other one semiconductor device controlled according to the pulse signal shown in FIG. 5B.

A period between a third time point t3 and a fourth time point t4 in FIG. 5C and a period between an eighth time point t8 and a ninth time point t9 in FIG. 5D indicate a mirror period for charging a mirror capacitor. A threshold voltage of each gate electrode is lower than a voltage in the mirror period. When a gate electrode is turned off, after the mirror capacitor is charged, a gate voltage is reduced to the threshold voltage, and then the gate voltage reaches an off-voltage at the fifth time point t5. When a gate electrode is turned on, after a gate voltage reaches the threshold voltage, the mirror capacitor is charged, and then the gate voltage reaches an on-voltage at a tenth time point t10.

In the example described above, a period (period from the first time point t1 to the tenth time point t10) from when a pulse signal for turning off the first gate electrode MG and the second gate electrode CGp of the one of the semiconductor devices is input to the drive device 50 to when any one of the first gate electrode MG, the second gate electrode CGp, and the third gate electrode CGs of the other one of the semiconductor devices reaches an on-voltage was described as an example of the dead time period. The dead time period in this case is defined as a longest dead time period.

A start point of the dead time period may be a time point at which the gate voltage $V_{MG}$ of the first gate electrode MG and the gate voltage $V_{CGp}$ of the second gate electrode CGp of a semiconductor device on the same side are not more than a threshold voltage. That is, the gate voltage $V_{CGs}$ of the third gate electrode CGs of the first semiconductor device 101 transitions from the first off-voltage to the second off-voltage after the gate voltage $V_{MG}$ of the first gate electrode MG and the gate voltage $V_{CGp}$ of the second gate electrode CGp of the first semiconductor device 101 are not more than a threshold voltage. The gate voltage $V_{CGs}$ of the third gate electrode CGs of the second semiconductor device 102 transitions from the third off-voltage to the fourth off-voltage after the gate voltage $V_{MG}$ of the first gate electrode MG and the gate voltage $V_{CGp}$ of the second gate electrode CGp of the second semiconductor device 102 are not more than a threshold voltage.

A start point of the dead time period may be a time point at which the first gate electrode MG and the second gate electrode CGp of a semiconductor device on the same side are turned off. That is, the gate voltage $V_{CGs}$ of the third gate electrode CGs of the first semiconductor device 101 transitions from the first off-voltage to the second off-voltage after the first gate electrode MG and the second gate electrode CGp of the first semiconductor device 101 are turned off. The gate voltage $V_{CGs}$ of the third gate electrode CGs of the second semiconductor device 102 transitions from the third off-voltage to the fourth off-voltage after the first gate electrode MG and the second gate electrode CGp of the second semiconductor device 102 are turned off.

An end point of the dead time period may be a time point at which a gate voltage of any one of the first gate electrode MG, the second gate electrode CGp, and the third gate electrode CGs of a semiconductor device on an opposite side reaches a threshold voltage. That is, the gate voltage $V_{CGs}$ of the third gate electrode CGs of the first semiconductor device 101 transitions from the first off-voltage to the second off-voltage during a period up to when a gate voltage of any one of the first gate electrode MG, the second gate electrode CGp, and the third gate electrode CGs of the second semiconductor device 102 reaches a threshold voltage. The gate voltage $V_{CGs}$ of the third gate electrode CGs of the second semiconductor device 102 transitions from the third off-voltage to the fourth off-voltage during a period up to when a gate voltage of any one of the first gate electrode MG, the second gate electrode CGp, and the third gate electrode CGs of the first semiconductor device 101 reaches a threshold voltage.

An end point of the dead time period may be a time point at which a gate voltage of any one of the first gate electrode MG, the second gate electrode CGp, and the third gate electrode CGs of a semiconductor device on an opposite side is increased from an off-voltage. That is, the gate voltage $V_{CGs}$ of the third gate electrode CGs of the first semiconductor device 101 transitions from the first off-voltage to the second off-voltage during a period up to when a gate voltage of any one of the first gate electrode MG, the second gate electrode CGp, and the third gate electrode CGs of the second semiconductor device 102 is higher than an off-voltage. The gate voltage $V_{CGs}$ of the third gate electrode CGs of the second semiconductor device 102 transitions from the third off-voltage to the fourth off-voltage during a period up to when a gate voltage of any one of the first gate electrode MG, the second gate electrode CGp, and the third gate electrode CGs of the first semiconductor device 101 is higher than an off-voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor module comprising:

a first semiconductor device and a second semiconductor device each having a first gate electrode, a second gate electrode, and a third gate electrode, the first gate electrode, the second gate electrode, and the third gate electrode being controlled independently of one another, and during a period from when the first gate electrode is turned on to when the first gate electrode is turned off, an on-period of the second gate electrode being shorter than an on-period of the first gate electrode, and an on-period of the third gate electrode being shorter than the on-period of the second gate electrode; and a drive device configured to drive the first semiconductor device and the second semiconductor device, a voltage of the third gate electrode of the first semiconductor device transitioning from a first off-voltage that is not more than a threshold voltage to a second off-voltage lower than the first off-voltage during a period from when a pulse signal for turning off the first gate electrode and the second gate electrode of the first semiconductor device is input to the drive device to when any one of the first gate electrode, the second gate electrode, and the third gate electrode of the second semiconductor device reaches an on-voltage, and a voltage of the third gate electrode of the second semiconductor device transitioning from a third off-voltage that is not more than a threshold voltage to a fourth off-voltage lower than the third off-voltage during a period from when a pulse signal for turning off the first gate electrode and the second gate electrode of the second semiconductor device is input to the drive device to when any one of the first gate electrode, the second gate electrode, and the third gate electrode of the first semiconductor device reaches an on-voltage.

2. The module according to claim 1, wherein after the voltage of the third gate electrode of the first semiconductor device transitions to the second off-voltage and the first gate electrode and the second gate electrode of the second semiconductor device are turned on, the voltage of the third gate electrode of the first semiconductor device returns to the first off-voltage during a period up to when the first gate electrode and the second gate electrode of the first semiconductor device are turned on, and after the voltage of the third gate electrode of the second semiconductor device transitions to the fourth off-voltage and the first gate electrode and the second gate electrode of the first semiconductor device are turned on, the voltage of the third gate electrode of the second semiconductor device returns the third off-voltage during a period up to when the first gate electrode and the second gate electrode of the second semiconductor device are turned on.

3. The module according to claim 1, wherein the voltage of the third gate electrode of the first semiconductor device transitions from the first off-voltage to the second off-voltage after a voltage of the first gate electrode and a voltage of the second gate electrode of the first semiconductor device are not more than a threshold voltage, and the voltage of the third gate electrode of the second semiconductor device transitions from the third off-voltage to the fourth off-voltage after a voltage of the first gate electrode and a voltage of the second gate electrode of the second semiconductor device are not more than a threshold voltage.

4. The module according to claim 1, wherein the voltage of the third gate electrode of the first semiconductor device transitions from the first off-voltage to the second off-voltage after the first gate electrode and the second gate electrode of the first semiconductor device are turned off, and the voltage of the third gate electrode of the second semiconductor device transitions from the third off-voltage to the fourth off-voltage after the first gate electrode and the second gate electrode of the second semiconductor device are turned off.

5. The module according to claim 1, wherein the voltage of the third gate electrode of the first semiconductor device transitions from the first off-voltage to the second off-voltage during a period up to when a voltage of any one of the first gate electrode, the second gate electrode, and the third gate electrode of the second semiconductor device reaches a threshold voltage, and the voltage of the third gate electrode of the second semiconductor device transitions from the third off-voltage to the fourth off-voltage during a period up to when a voltage of any one of the first gate electrode, the second gate electrode, and the third gate electrode of the first semiconductor device reaches a threshold voltage.

6. The module according to claim 1, wherein the voltage of the third gate electrode of the first semiconductor device transitions from the first off-voltage to the second off-voltage during a period up to when a voltage of any one of the first gate electrode, the second gate electrode, and the third gate electrode of the second semiconductor device is higher than an off-voltage, and the voltage of the third gate electrode of the second semiconductor device transitions from the third off-voltage to the fourth off-voltage during a period up to when a voltage of any one of the first gate electrode, the second gate electrode, and the third gate electrode of the first semiconductor device is higher than an off-voltage.

7. The module according to claim 1, wherein the first semiconductor device and the second semiconductor device are insulated gate bipolar transistors, and an emitter electrode of the first semiconductor device is connected to a collector electrode of the second semiconductor device.

8. The module according to claim 1, wherein the second off-voltage and the fourth off-voltage are negative voltages.

9. The module according to claim 8, wherein a voltage of the first gate electrode and a voltage of the second gate electrode of the first semiconductor device when the first semiconductor device is turned off are negative voltages, and a voltage of the first gate electrode and a voltage of the second gate electrode of the second semiconductor device when the second semiconductor device is turned off are negative voltages.

10. The module according to claim 1, further comprising:

a pulse generator having an output connected to an input of the drive device.

11. A semiconductor module comprising:

a first semiconductor device and a second semiconductor device each having a first gate electrode, a second gate electrode, and a third gate electrode, the first gate electrode, the second gate electrode, and the third gate electrode being controlled independently of one another, and during a period from when the first gate electrode is turned on to when the first gate electrode is turned off, an on-period of the second gate electrode being shorter than an on-period of the first gate electrode, and an on-period of the third gate electrode being shorter than the on-period of the second gate electrode; and a drive device configured to drive the first semiconductor device and the second semiconductor device, a voltage of the third gate electrode of the first semiconductor device transitioning from a first off-voltage that is not more than a threshold voltage to a second off-voltage lower than the first off-voltage during a period from when the first gate electrode and the second gate electrode of the first semiconductor device are turned off to when any one of the first gate electrode, the second gate electrode, and the third gate electrode of the second semiconductor device reaches an on-voltage, and a voltage of the third gate electrode of the second semiconductor device transitioning from a third off-voltage that is not more than a threshold voltage to a fourth off-voltage lower than the third off-voltage during a period from when the first gate electrode and the second gate electrode of the second semiconductor device are turned off to when any one of the first gate electrode, the second gate electrode, and the third gate electrode of the first semiconductor device reaches an on-voltage.

*     *     *     *     *